United States Patent [19]
Kollanyi et al.

[11] Patent Number: 4,809,286
[45] Date of Patent: Feb. 28, 1989

[54] LASER DRIVER CIRCUIT

[75] Inventors: Miklos J. Kollanyi; Frankie P. Buchanan, both of Albuquerque, N. Mex.

[73] Assignee: GTE Communication Systems Corporation, Phoenix, Ariz.

[21] Appl. No.: 205,012

[22] Filed: May 31, 1988

Related U.S. Application Data
[63] Continuation of Ser. No. 944,046, Dec. 22, 1986.

[51] Int. Cl.$^4$ .............................................. H01S 3/00
[52] U.S. Cl. ......................................... 372/38; 372/26
[58] Field of Search ................... 372/9, 26, 29, 33, 38

[56] References Cited
U.S. PATENT DOCUMENTS
4,009,385 2/1977 Sell ....................................... 250/199
4,081,670 3/1978 Albanese ............................. 250/199

FOREIGN PATENT DOCUMENTS
0234389 11/1985 Japan ...................................... 372/26

Primary Examiner—William L. Sikes
Assistant Examiner—B. Randolph
Attorney, Agent, or Firm—Anthony Miologos

[57] ABSTRACT

A laser driver circuit is disclosed for operating an electrical current driven light emitting device or laser. The laser driver circuit is driven from external equipment by a modulated electrical signal and includes a laser biasing network arranged to provide a threshold current to the laser. The current is sufficient to bias the laser to an operating point just below the laser's turn on threshold. First and second transistors connected to the laser form a differential switching amplifier. The differential switching amplifier is disposed to switch drive current provided by a constant current source to the laser. The drive current is sufficient to drive the laser over the threshold set by the laser biasing network. On the application of the modulated electrical signal to the first transistor of the differential switching amplifier the drive current is switched from one side of the differential switching amplifier to the other effectively turning the laser on and off.

4 Claims, 2 Drawing Sheets

LASER DRIVER CIRCUIT

CROSS-REFERENCE TO RELATED APPLICATIONS

This is a continuation of applicaton Ser. No. 944,046 filed on Dec. 22, 1986.

The present application is related to the following co-pending U.S. patent applications all having a common assignee:

Ser. No. 944,045, titled, "OPTICAL DETECTOR CIRCUIT";

Ser. No. 944,043, titled, "LASER DC BIAS CONTROLLER";

Ser. No. 944,044, titled, "LASER TEMPERATURE CONTROLLER";

Ser. No. 944,042, titled, "LOSS OF OPTICAL INPUT CIRCUIT";

BACKGROUND OF THE INVENTION

This invention relates in general to fiber-optic receiver/transmitter arrangements and more specifically to a novel laser driver circuit for a fiber-optic transmitter.

Fiber-optic receivers and transmitters or fiber-optic interface units are used in modern telecommunications and data transmission systems between an optical fiber transmission line and electronic digital equipment. The fiber-optic transmitter receivers electrical signals from the electronic equipment representing the data to be transmitted. The transmitter then converts the data to light pulses which are coupled to an optical fiber transmission line. The fiber-optic receiver receives light pulses representing the transmitted data from an optical fiber transmission line and converts the light pulses to electrical signals which are sent to and processed by the electronic digital equipment. These systems work in very high transmission rates from 145 Mbs to 2400 Mbs (Megabits per second).

Transmission of data or other signals along optical fiber transmission lines have advantage in the fact that light rays are almost immune to electromagnetic interference such as sparks, lightening, crosstalk and other interference which may be induced into the transmission line.

Laser driver circuits, found in the fiber-optic transmitter, receive data to be transmitted at electrical signals usually in the form of pulse modulation from the digital equipment. The laser driver uses the received modulation to trigger a solid state laser emitter thereby, converting the electrical signals into light pulses.

These circuits require extremely stable operating characteristics since the speed of modulation that the circuit operates in is in the range of over 100Mbs (megabits per second). Further, since the modulation speed is close to the microwave region the circuit must operate relatively free from spurious oscillations which would cause it to malfunction and erroneously modulate the laser.

It therefore becomes an object of the present invention to disclose a novel laser driver circuit exhibiting all of advantageous discussed above.

SUMMARY OF THE INVENTION

In accomplishing the object of the present invention there is provided a laser driver circuit for turning on and off an electrical current driven light emitting device or laser. The circuit is driven from external equipment by a modulated electrical signal.

The laser driver circuit includes, light emitting device biasing means arranged to provide an electrical current to the light emitting device sufficient to bias the light emitting device to an operating point just below an operating or turn on threshold. First and second current switching means are connected to the light emitting device and also to biasing means. The biasing means is disposed to provide an electrical bias voltage to the first and second current switching means thereby, turning the first and the second switching means on.

The circuit further includes, constant current means connected to the first and second switching means and arranged to provide drive current sufficient to drive the light emitting device over the threshold set by the light emitting device biasing means.

The laser is operated by the application of the modulated electrical signal to the first switching means. The modulated electrical signal turns the first switching means off and on effectively switching the drive current from the first switching means to the second switching means and back thereby, turning the light emitting device on and off respectively.

A BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
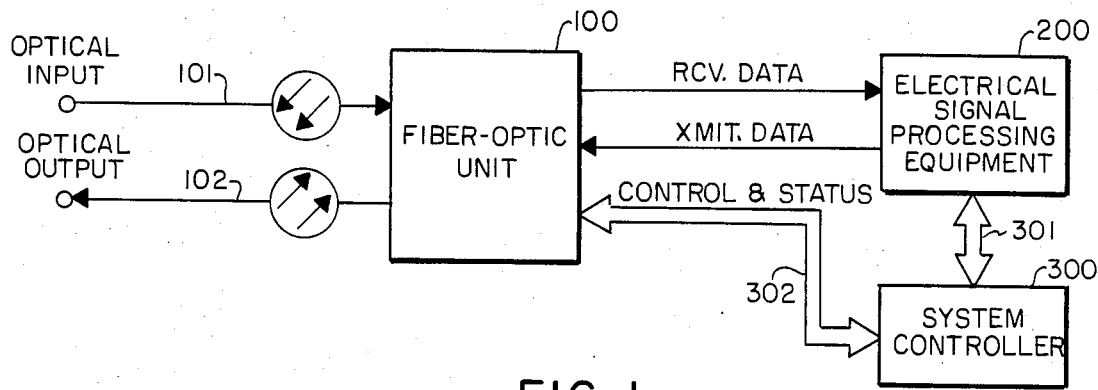
FIG. 1 is a block diagram of illustrating the interconnections of a Fiber-Optic Interface Unit to Electrical Signal Processing Equipment and to a System Controller.

Turning now to FIG. 1 of the included drawings a representation of a system for converting electrical modulation signals to light pulses and which includes laser driver of the present invention is shown. The system shown includes a Fiber Optic Unit (FOU) 100, Electrical Signal Processing Equipment (ESP) 200 and a System Controller (SC) 300.

In the receive path, (data flow away from the optical fiber) a single mode optical fiber light guide is terminated in the FOU 100. The FOU 100 detects the light pulses and converts the received light pulses to electrical pulses. The electrical pulses are amplified and then fed via the RCV DATA line to the ESP 200 equipment where the received data is recovered and used. The ESP 200 equipment can be any digital and/or analog device which can use the recovered data. For example, in telecommunication equipment the ESP equipment can represent a switching system for routing telephone calls from one subscriber to the other. Still in another example the ESP equipment could represent a central computer connected to peripheral terminals via a fiber-optic network.

In the transmit path, (data flow toward the optical fiber) electrical signals in the form of digital pulses are fed to the FOU 100 from the ESP 200 via XMT DATA line. The digital pulses are then passed to a laser driver circuit in the FOU 100 which intensity modulates a solid state laser. The optical energy from the laser is coupled into a single mode optical fiber 102 and transmitted as light pulses down the optical fiber to receiving equipment (not shown). A system control SC 300 receives and sends control and status information from/to the FOU 100. For example, the controller can monitor the FOU to determine if an optical signal is being received in order to signal the ESP 200 that data from the FOU is available, or the SC 300 can receive status information concerning the temperature of the transmitting laser or if it has failed.

Figure 2:
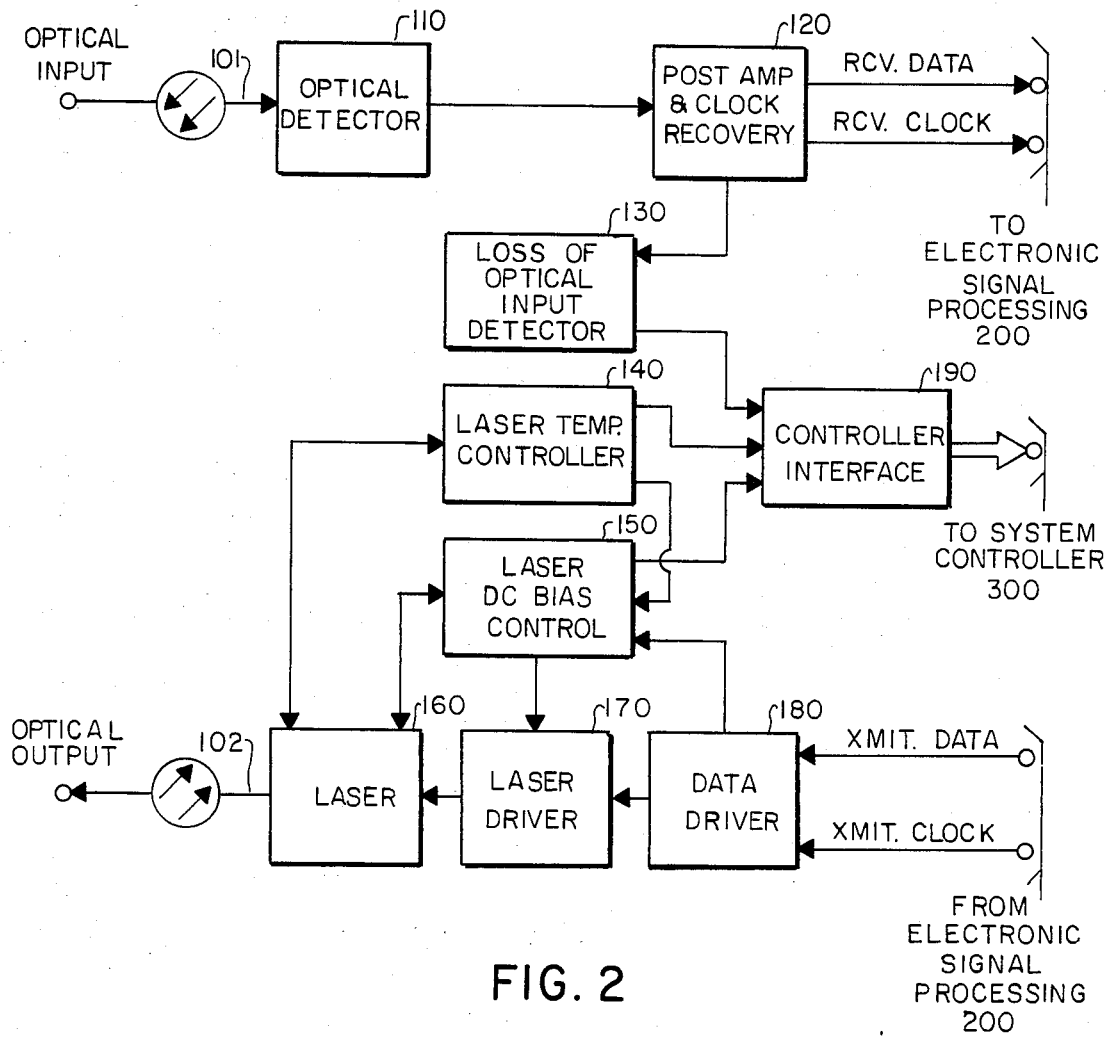
FIG. 2 is block diagram detailing the structure of the Fiber-Optic Unit and including the optical detector of the present invention.

Turning now to FIG. 2 a description and explanation of the operation of the FOU 100 of the above described system will now be given. In the receive path, the Optical Fiber input 101 is input to an Optical Detector 110. The Optical Detector converts the optical energy into electrical signals and then amplifies the received signals.

The amplified electrical signals are passed to a Post Amp & Clock Recovery Circuit 120 where they are further amplified and a clock signal is extracted from the input electrical signal. The extracted clock is reclocked and the data and clock are passed on to the ESP 200 via the RCV, DATA line and RCV, CLOCK line respectively.

A Loss of Optical Input Detector 130 is connected to the Post Amp & Clock Recovery Circuit. The Loss of Optical input Detector 130 is arranged to send an alarm signal to a Controller Interface 190 whenever the optical input level drops below a preset threshold. The Controller Interface 190 then outputs the alarm to the SC 300.

In the transmit path, electrical signals in the form of digital pulses and a clock signal are input to the Data Driver 180 from the ESP 200 on lines XMT, DATA and XMT, CLOCK respectively. The Data Driver reclocks the data transmitted from ESP 200 using the XMT, CLOCK signal. The output of the Data Driver 180 is sent to the Laser Driver circuit 170 which in turn modulates Laser 160 converting the input electrical signals to an optical signal. The Laser's light output is coupled into a single mode fiber and transmitted out on Optical Output 102.

The transmit path further includes a Laser DC Bias Control arranged to turn off the Laser 160 in case the data drive fails. This prevents the Laser from being continuously turned on.

A Laser Temperature Controller 140 is also included and used to control the laser's temperature and also the optical output level. Both the laser temperature controller 140 and Laser DC Bias Control 150 send alarm signals to the Controller Interface 190 in the event that the laser has failed, its temperature is out of limits, or the Data Drive circuit has failed.

Figure 3:
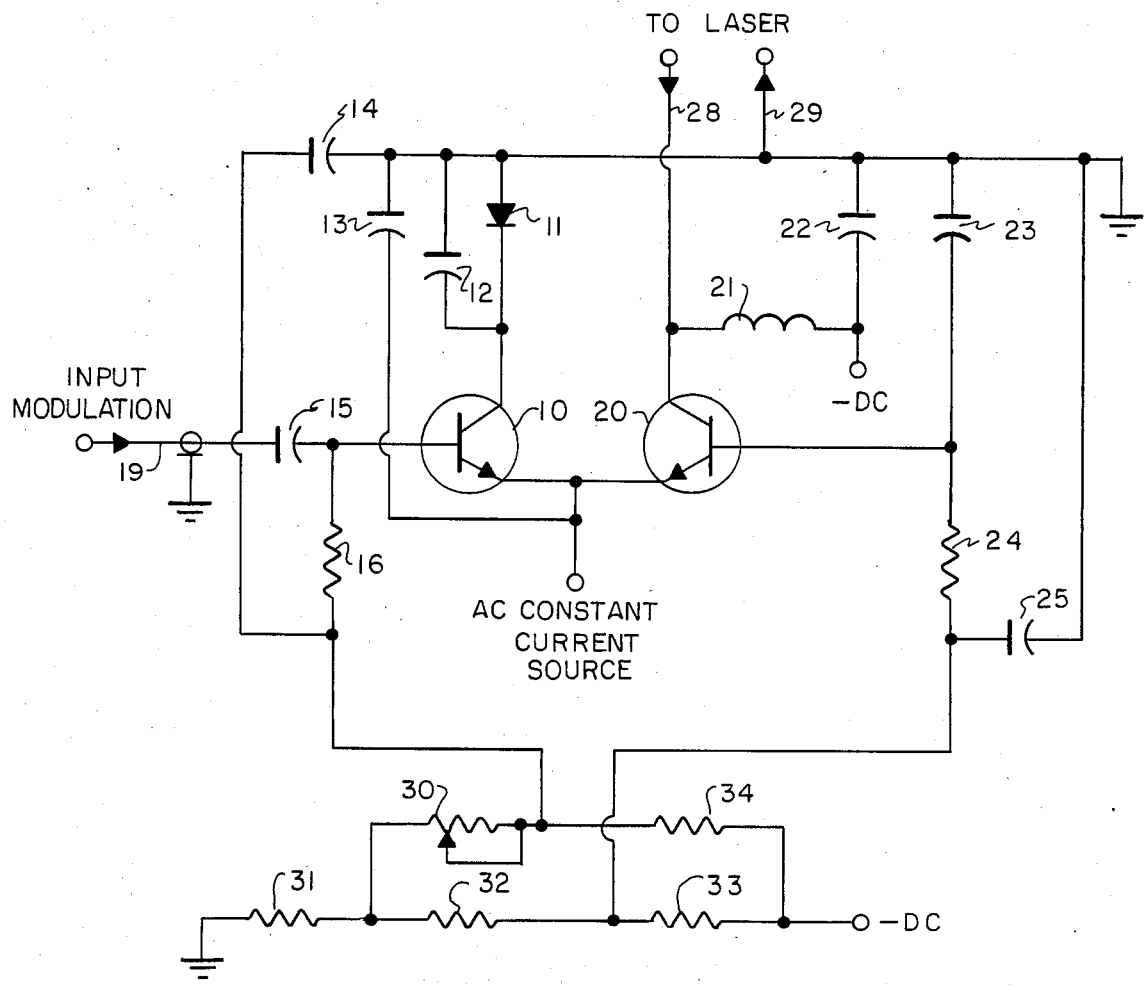
FIG. 3 is detailed schematic of the laser driver circuit of the present invention.

Turning now to FIG. 3 a description of the laser driver circuit 170 will now be given. The laser driver will receive a high speed electrical modulatoin signal via input lead 19 and modulate laser 160. Laser 160 is connected to the laser driver circuit via leads 28 and 29. The modulation of the laser will produce an optical conversion of the input electrical signal.

The laser 160 is a threshold device, that is, it operates in a linear range in which the light output is proportional to the incremental current above the set threshold. The laser is normally prebiased to a point near threshold so that an extinction ratio of 20:1 can be attained.

The driver circuit is prepared for operation by providing a DC prebias of the laser. The prebias is proided by coil 21 and capacitor 22 from a negative DC current source. The prebias will provide a DC constant current source of approximately 5 mA to 35 mA to the laser 160 to achieve its threshold.

A voltage divider comprised of resistors 31, 32 and 33 provide the DC bias for transistors 10 and 20. With the proper DC bias applied, both transistors 10 and 20 are turned on but no current flow through the collector-emitter junction of transistors 10 and 20 occurs. The DC bias of transistor 10 is controlled by adjustable resistor 30 which allows the bias point to be adjusted +/−0.15 volts around the bias point of translator 20. This function is necessary to suppress high frequency oscillations in the unmodulated state.

The AC constant current source is superimposed on the DC current provided by the circuit above. Transistors 10 and 20 in this configuration form a high speed differential switching amplifier. The transistor pair switches the current provided by the AC constant current source from one transistor to the other effectively turning the laser on or off. The switching threshold is approximately −2.8 to −2.9 volts relative to ground.

The current is switched by the application of an AC modulation signal via lead 19 to the base of transistor 10. As can be seen, capacitor 15 AC couples the modulation input to the transistor 10. With transistor 10 on, majority current flows from ground through diode 11 the collector-emitter of transistor 10 to the AC constant current source. Not enough current flows thru lead 29 and back on lead 28 to drive the laser above the threshold. Diode 11 provides DC balance and simulates the voltage drop of the laser.

On the negative transition of the AC modulation signal transistor 10 is switched off swtiching majority current flow thru the laser from lead 29 which is at ground potential back to the circuit via lead 28 which is at a more negative potential with respect to the ground. With the majority current thru this path, the operating current for the laser exceeds that which is provided by the prebias thereby, effectively turning the laser 160 on and developing a light output.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit for turning on and off an electrical current driven light emitting device from a modulated electrical signal, said circuit comprising:
   light emitting device biasing means connected to said light emitting device arranged to provide an electrical current to said light emitting device sufficient to bias said light emitting device to an operating point just below a turn on threshold;
   first and second current switching means each connected to an AC constant current source and to said light emitting device, said first and second switching means arranged to switch drive current between said AC constant current source to said light emitting device, whereby said second switching means provides sufficient current above said turn on threshold to render said light emitting device operated;

a voltage divider network further connected to said first and second current switching means and to a source of voltage potential is arranged to provide an electrical bias voltage to said first and second current switching means rendering said first and second switching means on and ready to switch drive current from said constant current source to said light emitting device; and, responsive to the positive transition of said modulated electrical signal applied to said first switching means, said first switching means allows the majority of said drive current to flow thru said first switching means, rendering said light emitting device not operated, and alternatively responsive to a negative transition of said modulated electrical signal applied to said first switching means, said first switching means prevents drive current from flowing thru said first switching means allowing the majority of said drive current to flow thru said second switching means, rendering said light emitting device operated.

2. A light emitting device driver circuit comprising:
a current driven light emitting device including first and second electrical connections, said second electrical connection terminated to an electrical path connected to ground potential;
a first transistor including a collector lead connected to said electrical path, an emitter lead connected to a source of driver current and a base lead connected to a source of DC bias voltage, said source of DC bias voltage arranged to turn said first transistor on;
a second transistor including a collector lead connected to said current driven light emitting device first electrical connection, an emitter lead connected to said source of drive current and its base lead connected to said source of DC bias voltage, said source of DC bias voltage arranged to turn said second transistor on; and,
said first transistor base lead further connected to a source of modulation signals, and responsive to the positive transition of said modulation signals, said first transistor is operated establishing an electrical path for the flow of majority drive current between said drive current source, said first transistor and said ground potential, rendering said light emitting device non-operated and alternatively, responsive to the negative transition of said modulation signal said first transistor is non-operated establishing an electrical path for the flow of majority drive current between said source of drive current, said second transistor, said light emitting device and said ground potential, rendering said light emitting device operated.

3. A light emitting device driver circuit comprising:
a light emitting device including first and second electrical connections, said second electrical connection terminated to an electrical path connected to ground potential;
first switching means connected to said electrical path, and to a source of drive current, and said first switching means further connected to a source of bias voltage, said bias voltage arranged to turn said first switching means on;
second switching means connected to said light emitting device first electrical connection and to said source of drive current, and said second switching means further connected to said source of bias voltage, said bias voltage arranged to turn said second switching means on; and
said first switching means further connected to a source of modulation signals, and responsive to the positive transition of said modulation signals, said first switching means is operated establishing an electrical path for the flow of majority drive current between said drive current source, said first switching means and said ground potential, rendering said light emitting device non-operated and alternatively, responsive to the negative transition of said modulation signal said first switching means is rendered non-operated establishing an electrical path for the flow of majority drive current between said source of drive current, said second switching means, said light emitting device and said ground potential, rendering said light emitting device operated.

4. A light emitting device driver circuit comprising:
a light emitting device including first and second electrical connections, said second electrical connection terminated to ground potential;
first means connected to said ground potential, and to a source of drive current, and said first means further connected to a source of bias voltage, said bias voltage arranged to turn said first means on;
second means connected to said light emitting device first electrical connection and to said source of drive current, and said second means further connected to said source of bias voltage, said bias voltage arranged to turn said second means on; and,
said first means further connected to a source of modulation signals, and responsive to a first transition of said modulation signals, said first menas establishes an electrical path for the flow of said drive current between said drive current source and said ground potential, rendering said light emitting device non-operated and alternatively, responsive to a second transition of said modulation signal said first means establishes an electrical path for the flow of drive current to said light emitting device between said source of drive current, said second switching means and said ground potential, rendering said light emitting device operated.

* * * * *